(12) United States Patent
Liu et al.

(10) Patent No.: US 10,203,362 B2
(45) Date of Patent: Feb. 12, 2019

(54) MANUAL SERVICE DISCONNECT FUSE STATE DETERMINATION SYSTEMS AND METHODS

(71) Applicant: GM GLOBAL TECHNOLOGY OPERATIONS LLC, Detroit, MI (US)

(72) Inventors: Wei Liu, Warren, MI (US); Pablo Valencia, Jr., Northville, MI (US); M. Saif Siddiqui, Troy, MI (US); Michael A. Celotto, Fenton, MI (US); Majdi F. Fakhoury, Sterling Heights, MI (US); John J. Lee, Novi, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 224 days.

(21) Appl. No.: 14/720,029

(22) Filed: May 22, 2015

(65) Prior Publication Data

US 2016/0341777 A1 Nov. 24, 2016

(51) Int. Cl.
| | |
|---|---|
| *G01R 31/00* | (2006.01) |
| *G01R 31/327* | (2006.01) |
| *G01R 31/07* | (2006.01) |
| *H01H 85/02* | (2006.01) |

(52) U.S. Cl.
CPC ........... *G01R 31/007* (2013.01); *G01R 31/07* (2013.01); *H01H 85/02* (2013.01)

(58) Field of Classification Search
CPC .............................. G01R 31/007; G01R 31/07
USPC ....................................... 702/62–64, 199, 57
See application file for complete search history.

(56) References Cited

U.S. PATENT DOCUMENTS

| | | | |
|---|---|---|---|
| 2006/0077611 A1* | 4/2006 | Bender | G06Q 10/06 361/104 |
| 2010/0023286 A1* | 1/2010 | Rodseth | G01R 31/07 702/65 |
| 2014/0193990 A1* | 7/2014 | Zhao | H01R 13/648 439/160 |
| 2016/0254661 A1* | 9/2016 | Matsumoto | B60R 16/033 361/31 |

FOREIGN PATENT DOCUMENTS

CN 104749527 A * 7/2015

* cited by examiner

*Primary Examiner* — Christine A Enad
(74) *Attorney, Agent, or Firm* — Quinn IP Law

(57) ABSTRACT

System and methods for estimating a state if a fuse are presented. In some embodiments, the disclosed systems and methods may be utilized in connection with estimating a state of a fuse associated with a manual service disconnect associated with an energy storage system included in a vehicle. Consistent with embodiments disclosed herein, a current event counting-based method utilizing one or more weighted time data buckets associated with various current levels may be used in connection with estimating MSD fuse life. In some embodiments, a MSD fuse end-of-service life signal may be triggered when a total time associated in the weighted time data buckets exceed a threshold value.

12 Claims, 4 Drawing Sheets

MANUAL SERVICE DISCONNECT FUSE STATE DETERMINATION SYSTEMS AND METHODS

TECHNICAL FIELD

This disclosure relates to systems and methods for detecting a state of a fuse associated with a battery system. More specifically, but not exclusively, the systems and methods of the present disclosure provide for determination of a state of a fuse included in a manual service disconnect ("MSD") associated with a battery system.

BACKGROUND

Passenger vehicles often include electric batteries for operating features of a vehicle's electrical and drivetrain systems. For example, in a hybrid-electric vehicle ("HEV"), a plug-in hybrid electric vehicle ("PHEV"), a fuel cell electric vehicle ("FCEV"), or a purely electric vehicle ("EV"), an energy storage system ("ESS") (e.g., a rechargeable ESS) may be used to power electric drivetrain components of the vehicle (e.g., electric drive motors and the like). The ESS may store high-voltage electrical energy, which may be transmitted to vehicle systems via a high-voltage ("HV") bus having positive and negative conductors or rails. The ESS may be selectively coupled to the positive and negative conductors or rails via one or more selectively switched electric contactors.

An ESS may be associated with a manual service disconnect ("MSD"). In some ESS systems, the MSD may be located at or near a midpoint of the ESS voltage (e.g., at or near a midpoint voltage of a cell stack of an associated battery system). When removed from an associated receptacle, the MSD may physically interrupt certain HV lines internal to the ESS, which may disable the ESS.

The MSD may include a fuse that may have an associated service life. With improvements in vehicle and/or ESS performance, the service life of a fuse included in a MSD associated with the vehicle's ESS may be affected. These effects on the service life of the fuse, however, may be difficult to accurately predict with conventional methods.

SUMMARY

Systems and methods are presented for estimating a state of fuse in a MSD of an ESS system, which may comprise a service life of the fuse. In some embodiments, the disclosed systems and methods may be used in connection with determining when a MSD fuse reaches the end of its associated service life. In further embodiments, the disclosed systems and methods may be used in connection with notifying a driver, owner, service technician or the like to replace the MSD fuse at and/or near the end of its service life, thereby reducing the likelihood of loss of vehicle power. Among other things, embodiments of the disclosed systems and methods may allow the performance of a vehicle and/or an ESS associated with the vehicle to be enhanced without upgrading an associated MSD fuse (e.g., which may require in other component and/or subsystem changes).

The estimated service life of a MSD fuse may vary based on the operation of an associated vehicle. Consistent with embodiments disclosed herein, a current event counting-based method utilizing one or more weighted time data buckets associated with various current levels may be used in connection with estimating MSD fuse life. In some embodiments, a MSD fuse end-of-service life signal may be triggered when a total time associated in the weighted time data buckets exceed a threshold value. In certain embodiments, the data buckets may be weighted based, at least in part, on characteristics of a fuse blow curve associated with a MSD fuse (e.g., based on the properties of the fuse material and/or configuration), a characterized maximum allowable operation duration at a certain current throughput (e.g., as may be provided by the fuse manufacturer or the like), and/or actual fuse durability test results. In further embodiments, the disclosed systems and methods may utilize a crest factor, accounting for an impact of certain short peak current events on MSD service life, and/or a form factor, accounting for an impact of certain vehicle driving/operation habits on MSD fuse service life.

In some embodiments, a method for estimating a life of a fuse associated with a MSD included in a vehicle may include receiving current information from a current sensor associated with the fuse that may comprise a measured current through the fuse over time. The received current information may be stored in one or more data buckets, each of the data buckets of the one or more data buckets being associated with a range of currents. In certain embodiments, storing the current information in the one or more data buckets may comprise determining count information for the one or more data buckets based on the received current information and the range of currents associated with each of the data buckets and storing the count information in the one or more associated data buckets.

In further embodiments, weighted count information for each of the one or more data buckets may be generated by applying a weight associated with a data bucket of the one or more data buckets to the count information in the associated data bucket. In some embodiments, the weight may comprise an indication of a relative amount of impact on a service life of the fuse associated with the count information in the associated data bucket.

Based on the weighted count information stored in the one or more data buckets, a state of the fuse may be determined. In some embodiments, determining the state of the fuse based on the weighted count information may comprise determining total count information based on the weighted count information, comparing the total count information with a threshold (e.g., a total service life of the fuse, a remaining service life of a fuse, etc.), and determining the state of the fuse based on the comparison. In further embodiments, at least one protective action based on the determined state of the fuse may be implemented. The protective action may include, for example, providing a notification to an operator of the vehicle of the determined state of the fuse, operating the vehicle in a limited operating mode based on the determined state of the fuse, and/or the like.

In certain embodiments, the aforementioned method may be performed by a BSE system and/or any other computing system and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
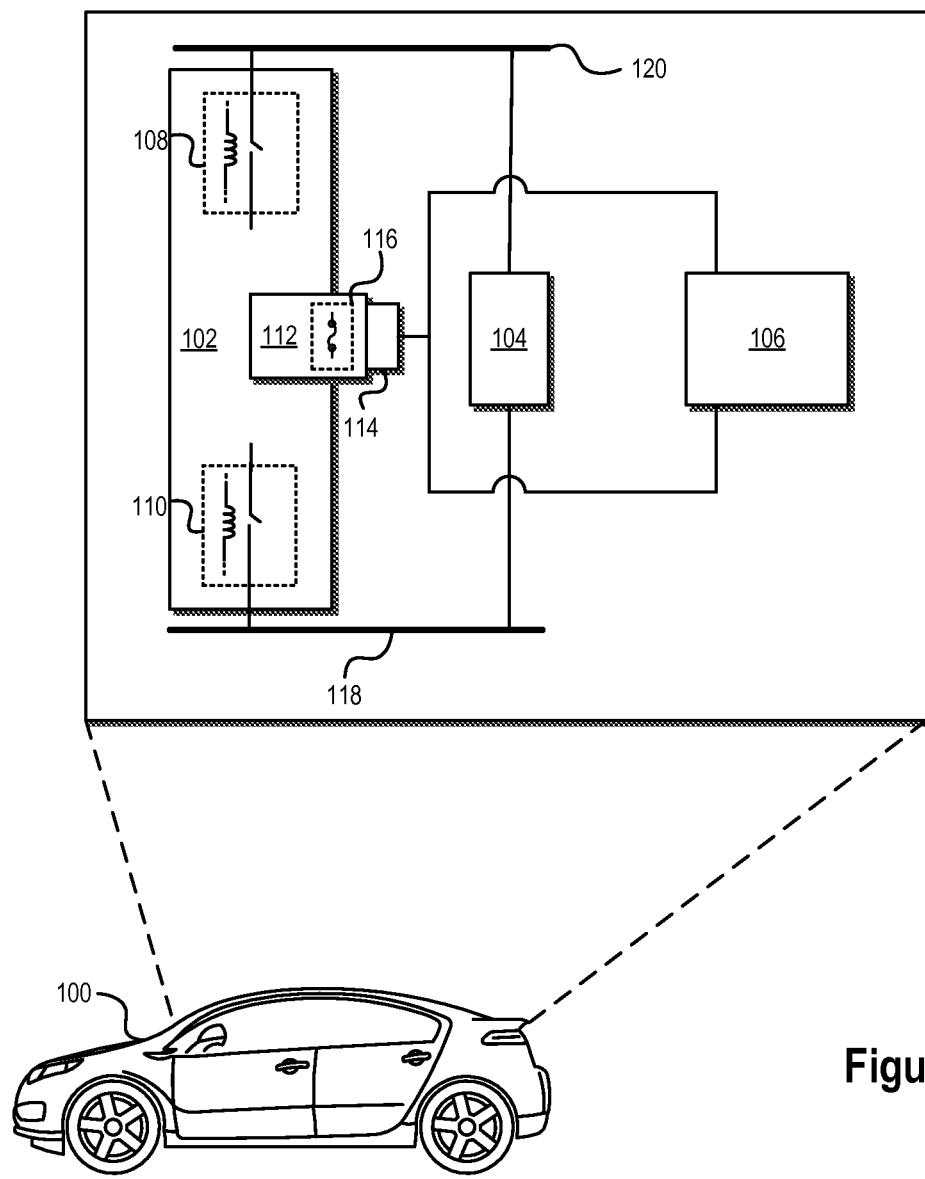
FIG. 1 illustrates an exemplary MSD of a battery system included in a vehicle consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Systems and methods disclosed herein may be utilized in connection with estimating a state of a fuse included in a MSD associated with an ESS. In some embodiments, the ESS may be included in a vehicle. Consistent with embodiments disclosed herein, a state of a MSD fuse may be associated with an estimated service life and/or remaining service life of the fuse.

The estimated service life of a MSD fuse may vary based on the operation of an associated vehicle. For example, in some circumstances, higher current events through the MSD fuse of a particular duration (e.g., as may be associated with certain vehicle driving events) may impact the service life of the fuse more than lower current events of the same duration. Similarly, current events at a particular current level of a longer duration may impact the service life of a MSD fuse more than current events of a shorter duration. In certain embodiments, the total service life of a MSD fuse may be determined based on characterization information relating fuse service life with current throughput and/or duration (e.g., as may be illustrated in connection with a fuse blow curve).

Consistent with embodiments disclosed herein, a current event counting-based method utilizing one or more weighted time data buckets associated with various current levels may be used in connection with estimating MSD fuse life. The duration of current events and/or associated current levels may be counted and stored in the associated time data buckets. In some embodiments, each of the one or more time data buckets may be weighted based on a relative impact to fuse service life. Based on the information included in the time data buckets, a state of a MSD fuse associated with an estimated service life and/or remaining service life of the fuse may be determined. In further embodiments, a crest factor, accounting for an impact of certain short peak current events on MSD fuse service life, and/or a form factor, accounting for an impact of certain vehicle driving and/or operation habits, may be used in connection with determining a state of a MSD fuse.

FIG. 1 illustrates an exemplary ESS 102 included in a vehicle 100 consistent with embodiments disclosed herein. The vehicle 100 may be a motor vehicle, a marine vehicle, an aircraft, and/or any other type of vehicle, and may include any suitable type of drivetrain for incorporating the systems and methods disclosed herein. Additional embodiments of the disclosed systems and methods may be utilized in connection with any other type of ESS 102 including, for example, stationary ESS systems (e.g., back-up power for a building and/or the like).

As illustrated, vehicle 100 may include an ESS 102 configured to provide electric energy and power to certain components of the vehicle 100. For example, the ESS 102 may be configured to provide energy and power to electric drivetrain components 104 of the vehicle 100. In certain embodiments, the drivetrain components 104 may comprise one or more electric motors such as, for example, one or more permanent magnet synchronous motors ("PMSMs"), induction motors, permanent magnet synchronous reluctance motors, switched reluctance motors, asynchronous motors, and/or any other types of suitable electric motor.

The ESS 102 may include one or more battery packs and/or battery cells (not shown) suitably sized to provide electrical power to vehicle systems utilizing any suitable battery technology or combination thereof. Suitable battery technologies may include, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), and/or other suitable battery technologies. In some embodiments, the ESS 102 may be a HV ESS.

The ESS 102 may store HV electrical energy that may be provided to vehicle systems via a HV bus having positive and negative conductors or rails 120, 118. The positive rail 120 may be selectively coupled to a positive terminal of the ESS 102 by a positive contactor 108. Similarly, the negative rail 118 may be selectively coupled to a negative terminal of the ESS 102 by a negative contactor 110. Electrical power provided by the ESS 102 to the positive and negative rails 120, 118 may in turn be provided to a power inverter system (not shown). The power inverter system may be coupled to drivetrain components 104, thereby delivering electric power from the ESS 102 to drivetrain components 104 when the positive and negative contactors 108, 110 are closed.

In certain embodiments, the ESS 102 may be coupled to a MSD 112. When removed from an associated receptacle, the MSD 112 may physically interrupt certain HV lines internal to the ESS 102, thereby disabling the ESS 102. The MSD 112 may be located at or near midpoint of the ESS voltage. In further embodiments, the MSD 112 may be located in a suitable location relative to the internal architecture of the ESS 102. In some embodiments, energy stored in the ESS 102 after disconnecting the MSD 112 may be discharged by an external discharging system coupled to an appropriate access point (not shown).

The MSD 112 may include one or more MSD fuses 116 that, in some embodiments, may have an associated service life. In certain embodiments, one or more sensors 114 (e.g., currents sensors or the like) may be associated with the MSD 112 and/or the MSD fuse 116 that may be configured to measure a current through the MSD fuse 116. In some embodiments, the sensors 114 may be configured to provide MSD fuse current information to a control system 106 associated with the ESS 102.

The control system 106 may comprise an internal ESS control system, an external ESS control system, and/or any other vehicle control and/or computer system. In further embodiments, the control system 106 may be configured to provide information to and/or receive information from other systems included in the vehicle 100 and/or an operator of the vehicle 100. For example, the control system 106 may be communicatively coupled to a vehicle infotainment and/or alert system and be configured to provide information regarding a state of the MSD fuse 116 consistent with the disclosed embodiments. Although illustrated in connection with a single control system 106, it will be appreciated that embodiments of the disclosed systems and methods may be implemented using a plurality of suitable control and/or computing systems.

Consistent with embodiments disclosed herein, based on information (e.g., current throughput information) received from the one or more sensors 114, the control system 106 may estimate a state of the MSD fuse 116. For example, in some embodiments, the control system 106 may implement embodiments of the disclosed systems and methods to estimate a service life of the MSD fuse 116 and/or a remaining service life of the MSD fuse 116. The control system 106 may further be configured to issue one or more control signals to other vehicle systems and/or associated notifications in response to the same.

It will be appreciated that a number of variations can be made to the architecture, relationships, and examples presented in connection with FIG. 1 within the scope of the inventive body of work. For example, certain device and/or system functionalities described above may be integrated into a single device and/or system and/or any suitable combination of devices and/or systems in any suitable configuration. Similarly, embodiments of the disclosed systems and methods may be utilized in a variety of fuses that, in certain circumstances, may not comprise a fuses included in a MSD 112 associated with a vehicle 100. Thus it will be appreciated that the architecture, relationships, and examples presented in connection with FIG. 1 are provided for purposes of illustration and explanation, and not limitation.

Figure 2:
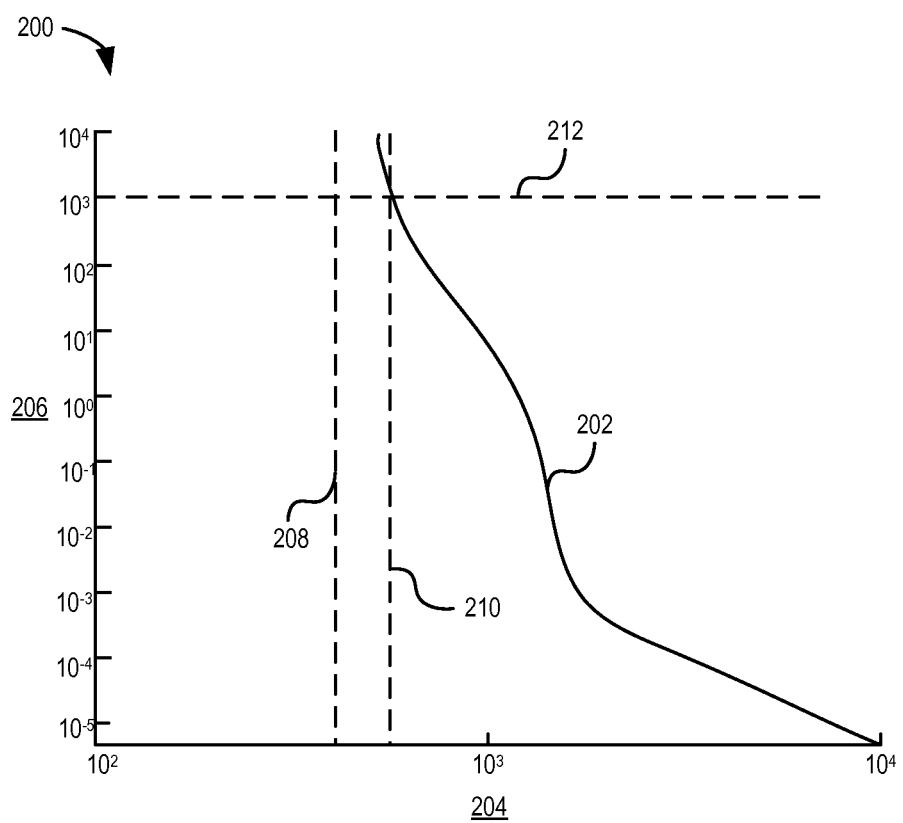
FIG. 2 illustrates a graph showing an exemplary MSD fuse blow curve associated with a MSD fuse included in a vehicle consistent with embodiments disclosed herein.

FIG. 2 illustrates a graph 200 showing an exemplary MSD fuse blow curve 202 associated with a MSD fuse included in a vehicle consistent with embodiments disclosed herein. In the illustrated graph 200, the x-axis represents a level of a current event 204 (e.g., measured in amps) and the y-axis represents a time of the current event 206 (e.g., measured in seconds).

As illustrated, at a first current level 208, a time to a fuse blow event and/or the end of the service life of the fuse may be relatively long. At a second current level 210 higher than the first current level, however, a time to a fuse blow event, indicated by line 212, may be relatively short. In this manner, higher current events may have a greater impact on service life of a MSD fuse than lower current events.

In certain embodiments, the durability of a MSD fuse may be associated with a MSD fuse blow curve 202 that may be described by an equation relating a fuse blow time to current through the fuse. For example, in the illustrated exemplary MSD fuse blow curve 202, the fuse blow time may be related to the current through the fuse according to:

$$T_1 = 10^{\wedge}(201.88*(LOG(I))^4 - 2450.82*(LOG(I))^3 + 11132.47*(LOG(I))^2 - 22434.75*(LOG(I)) + 16933.03) \quad \text{(Eq. 1)}$$

where $T_1$ is the fuse blow time in seconds and I is the current passing through the fuse in amps.

The durability of a MSD fuse may further be associated with a maximum allowable time relating to a single current event before fuse blow, which may be expressed according to:

$$T_2 = 4.75562621719717E + 21 * I_2^{\wedge}(-6.8058623) \quad \text{(Eq. 2)}$$

where $T_2$ is the maximum allowable time is seconds and $I_2$ is the current in Amps.

Figure 3:
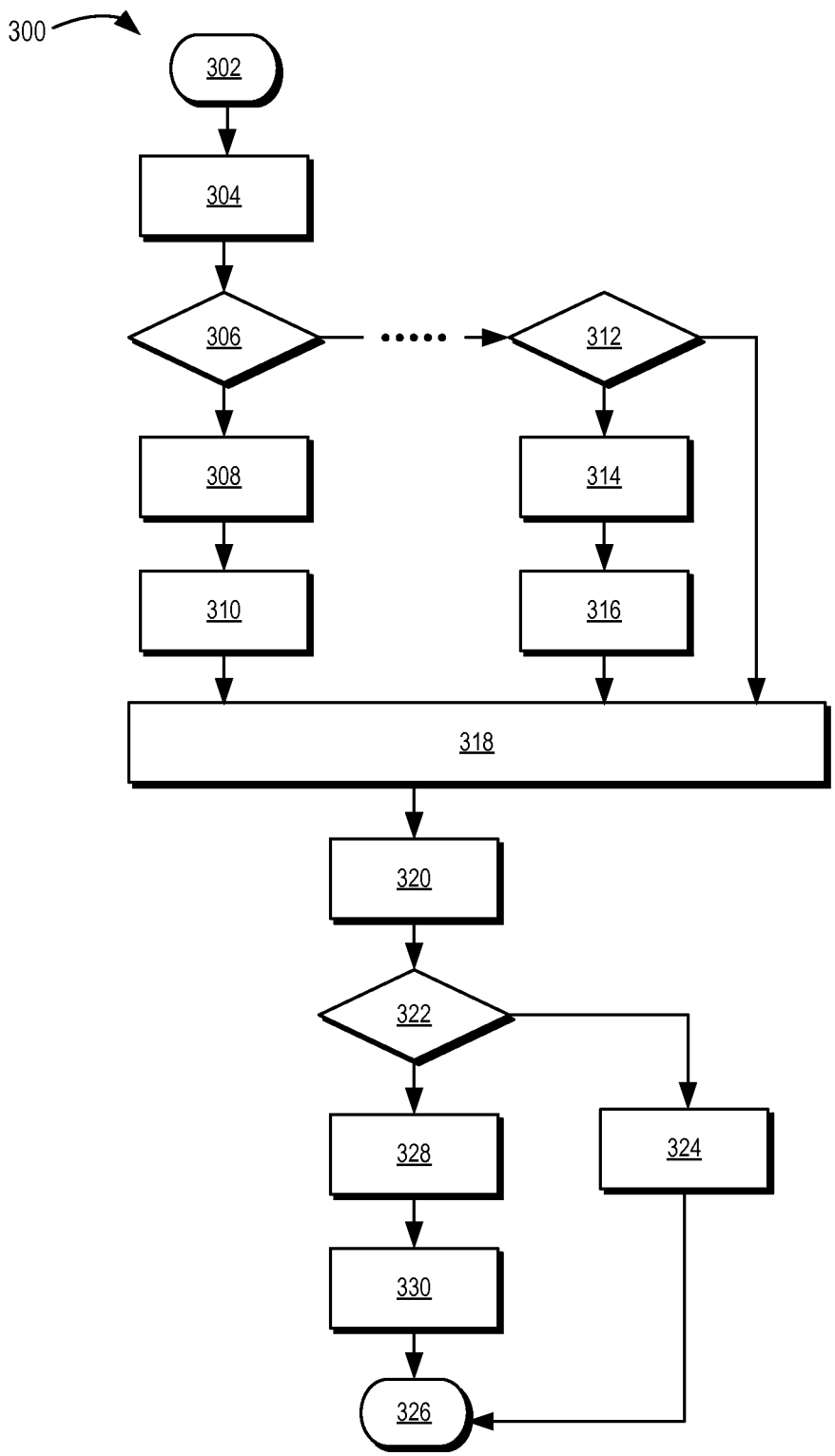
FIG. 3 illustrates a flow chart of an exemplary method for estimating a state of a fuse included in a MSD consistent with embodiments disclosed herein.

FIG. 3 illustrates a flow chart of an exemplary method 300 for estimating a life of a fuse included in a MSD consistent with embodiments disclosed herein. In some embodiments, the illustrated method 300 and/or any of its constituent steps may be performed using, at least in part, a control and/or computing system and/or one or more sensors (e.g., current sensors, voltage sensors, and/or the like) associated with a fuse included in a MSD of a vehicle ESS, although other suitable systems and/or combination of systems may also be utilized.

At 302, the method 300 may initiate. Current information relating to current through a fuse may be received at 304. In some embodiments, this current information may be received from a sensor associated with the fuse. Certain embodiments disclosed herein may utilize one or more data buckets associated with various current levels in connection with estimating a state of a fuse. Table 1, provided below, illustrates exemplary data buckets associated with varied current level ranges (e.g., measured in amps) consistent with the disclosed embodiments.

TABLE 1

| 160<=/<=180 time: x | 180</<=200 time: x | 200</<=220 time: x | 220</<=240 time: x | 240</<=260 time: x | 260</<=280 time: x |
|---|---|---|---|---|---|
| 280</<=300 time: x | 300</<=320 time: x | 320</<=340 time: x | 340</<=360 time: x | 360</<=380 time: x | 380</<=400 time: x |
| 400</<=420 time: x | 420</<=440 time: x | 440</<=460 time: x | 460</<=480 time: x | 480</<=500 time: x | 500</<=520 time: x |
| 520</<=540 time: x | 540</<=560 time: x | 560</<=580 time: x | 580</<=600 time: x | | |

At 306, a determination may be made whether the current information received at 304 falls within a range of currents associated with a first data bucket of a plurality of data buckets. If so, the method may proceed to 308, where a time the current information falls within the first data bucket may be counted and stored in the first data bucket.

At 310, the time information stored within the first data bucket may be weighted and/or otherwise scaled by a weight associated with the first data bucket. The weight associated with a data bucket may be based on a variety of factors and, in certain embodiments, may reflect a relative impact to fuse service life associated with time information stored within the data bucket. In some embodiments, a weight associated with a data bucket may be based, at least in part, on a fuse blow curve associated with a fuse and/or an equation describing the same (e.g., Equation 1), a maximum allowable time relating to a single current event before fuse blow and/or an equation describing the same (e.g., Equation 2, which may be provided by a supplier of the fuse and/or otherwise obtained through characterization testing of the fuse), and/or through an optimization process based on actual fuse durability test results.

A base weight factor for each data bucket, $W_o=[w_{1o} \ldots w_{23o}]$, may be generated. In some embodiments, the base weight factor may be generated based on first weight factors, $W_T=[w_{T1} \ldots w_{T23}]$, that may be generated based on a fuse blow curve associated with a fuse and/or an equation describing the same (e.g., Equation 1), and second weight factors, $W_{T2}=[w_{T21} \ldots w_{T223}]$, that may be generated based on a maximum allowable time relating to a single current event before fuse blow and/or an equation describing the same (e.g., Equation 2). In certain embodiments, a linear transformation may be used to combine the first and second weight factors to generate the base weight factor.

In some embodiments, the base weight factor may be calculated by generating fuse blow time values corresponding to a maximum current associated with each data bucket of a plurality of data buckets used in connection with the disclosed embodiments (e.g., as may be shown in Table 1). The time values may be summed to generate a total time and the time in each data bucket may be divided the total time to generate the base weight factor associated with each data bucket.

In certain embodiments, the base weight factor may be optimized to match a particular durability cycle pattern and/or characterization pattern (e.g., a cycle pattern modeling a driving pattern of a vehicle associated with an ESS) to generate a final weight factor associated with a data bucket $W=[w_1 \ldots w_{23}]$. In some embodiments, the base weight factor may be optimized against an objective function and/or a cost function, although a variety of other optimization processes may be used in connection with the disclosed embodiments. In some embodiments, the optimization process may allow weight factors associated with each data bucket to be adjusted so as to better model test data. In certain embodiments, the objective function and/or cost function may be expressed according to:

$$J = \sum_{i=1}^{n} |(\delta\omega_{01} \cdot t_1(i) + \ldots + \delta\omega_{023} \cdot t_{23}(i)) + \qquad \text{(Eq. 3)}$$
$$(w_{01} \cdot t_1(i) + \ldots + w_{023} \cdot t_{23}(i)) - T_{\textit{eff}}(i)|$$

where $t_j(i)$ is the total time of the jth bucket in the ith durability cycle pattern and $T_{\textit{eff}}(i)$ is the effective fuse damage time of one composite cycle of the ith durability test cycle pattern.

In certain embodiments, the optimization process may find the best $\delta\omega_j^*{}_{j=1 \ldots 23}$ from the based weight factor W which results in J=min, thereby finding a best match to the durability cycle pattern information. In some embodiments, the optimization process may be subject to the following constraints.

$$w_1=(\delta\omega_1^*+w_{01})<w_2=(\delta\chi_2^*+w_{02})< \ldots <w_{23}= (\delta\omega_{23*}+w_{023})|\delta\omega_1^*|\le w_{01} \cdot 5\% \ldots |\delta\omega_j^*|w_{0j} \cdot 5\% \ldots |\delta\omega_{23}^*|\le w_{023} \cdot 5\% \qquad \text{(Eq. 4)}$$

In certain embodiments, a principle setting scale factor, $S_f$, may be set so that the total of damage associated with an entire fuse service life equals 1. That is, the scale factor may be set so that an end of fuse service life threshold models test data. A principle setting fuse life target index, $L_{life}$, may be set determining a trigger point associated with an end-of-service life of the fuse.

In connection with determining an impact of a current event on fuse service life, embodiments of the disclosed systems and methods may utilize a crest factor. In some embodiments, the crest factor may account for an impact of certain short peak current events on MSD fuse service life. In certain embodiments, the crest factor may be based expressed for an ith data bucket according to the following:

$$\text{Crest factor}(i) = C_f(i) = \frac{I(i)}{I_{RMS}(i)} \qquad \text{(Eq. 5)}$$

which may be converted to a work crest factor, $k_{cf}(i)$.

Embodiments of the disclosed systems and methods may further utilize a form factor in connection with determining an impact of a current event on fuse service life. In some embodiments, a form factor may account for an impact of certain vehicle driving and/or operation habits on MSD fuse service life. In certain embodiments, the form factor may be expressed over a 2 second and 10 second window for an ith data bucket according to the following:

$$\text{Form factor}(i) = F_f(i) = \frac{I_{RMS}(i)}{I_{mean}(i)} \qquad \text{(Eq. 6)}$$

which may be converted to a work form factor, $k_{ff}(i)$.

In some embodiments, an impact of on effective service life of a MSD fuse associated with a particular data bucket that accounts for scale factor, the work crest factor, and/or the work form factor may be expressed according to the following:

$$\text{Effective service life time} = S_f (\Sigma_{i=1}^{23}((k_{cf}(i) \cdot k_{ff}(i) \cdot t_i) \cdot w_i) \qquad \text{(Eq. 7)}$$

In certain embodiments, the crest and/or form factors may be designed to reduce the effect of current measurement noise and/or spikes and/or otherwise smooth the impact of current waveform shape on fuse life. In certain embodiments, the determination process at 306, the counting and/storing process at 308, and the weighting and/or scaling process at 310 may be performed for each data bucket (e.g., each ith data bucket) of the one or more data buckets until the processes are performed on the final data bucket at 312, 314 and 316 respectively. In this manner, time information relating to the received of current information may be sorted and/or stored into associated current data buckets of the one or more data buckets and may be weighted and/or scaled according to a weight associated with the each of the data buckets. Table 2, provided below, illustrates exemplary data buckets, 23 in total, associated with varied weights and associated scaled time information consistent with the disclosed embodiments.

TABLE 2

| $1 - w_1 * t_1$ | $2 - w_2 * t_2$ | $3 - w_3 * t_3$ | $4 - w_4 * t_4$ | $5 - w_5 * t_5$ | $6 - w_6 * t_6$ |
|---|---|---|---|---|---|
| 0.18175 | 0.24994 | 0.02346 | 0.24067 | 0.016759 | 0.01592 |
| $7 - w_7 * t_7$ | $8 - w_8 * t_8$ | $9 - w_9 * t_9$ | $10 - w_{10} * t_{10}$ | $11 - w_{11} * t_{11}$ | $12 - w_{12} * t_{12}$ |
| 0.024895 | 0.041861 | 0.073938 | 0.205476 | 0.449962 | 0.958402 |
| $13 - w_{13} * t_{13}$ | $14 - w_{14} * t_{14}$ | $15 - w_{15} * t_{15}$ | $16 - w_{16} * t_{16}$ | $17 - w_{17} * t_{17}$ | $18 - w_{18} * t_{18}$ |
| 1.643155 | 3.25053 | 6.348343 | 18.66178 | 62.45522 | 100.3239 |
| $19 - w_{19} * t_{19}$ | $20 - w_{20} * t_{20}$ | $21 - w_{21} * t_{21}$ | $22 - w_{22} * t_{22}$ | $23 - w_{23} * t_{23}$ | Total time |
| 117.5123 | 154.0167 | 49.34152 | 0 | 0 | 515.4 |

At 318, the weighted time included in each bucket may be summed to determine an impact of fuse service life (e.g., a fuse damaging time) associated with the current information received at 304. For example, in the exemplary data buckets illustrated above in connection with Table 2, a total impact on fuse service life of the associated current information may be 515.4 seconds. Accordingly, for an exemplary fuse having a total service life of 16,995 seconds, the current information reflected in Table 2 may be associated with a use of approximately 3% of the total service life of the fuse (e.g., 515 s/16995 s).

At 320, fuse service life impact and/or fuse damaging time accumulated in a prior cycle of the method 300 may be added to the impact on fuse service life calculated at 318 to generate an updated accumulated fuse service life impact time. At 322, the updated accumulated fuse service life impact time may be compared with a total service life of the fuse and/or a threshold to determine if the updated accumulated fuse service life impact time equals or is greater than the threshold and/or total service life of the fuse. If not, the method 300 may proceed to 324 where the updated accumulated fuse service life impact time may be stored and the method 300 may terminate 326. If so, the method 300 may proceed to 328, where the updated accumulated fuse service life impact time may be stored and a control action may be implemented at 330 prior to the method 300 terminating at 326. The control action may comprise any suitable action including, without limitation, one or more of notifying a driver, owner, service technician or the like to replace the MSD fuse at and/or near the end of its service life (e.g., by issuing a control signal to a telematics system and/or any other system), limiting the operation of an associated vehicle to reduce additional damage to the fuse and reduce the likelihood of a fuse blow during vehicle operation (e.g., limiting the acceleration of the vehicle and/or the like), and/or the like.

Figure 4:
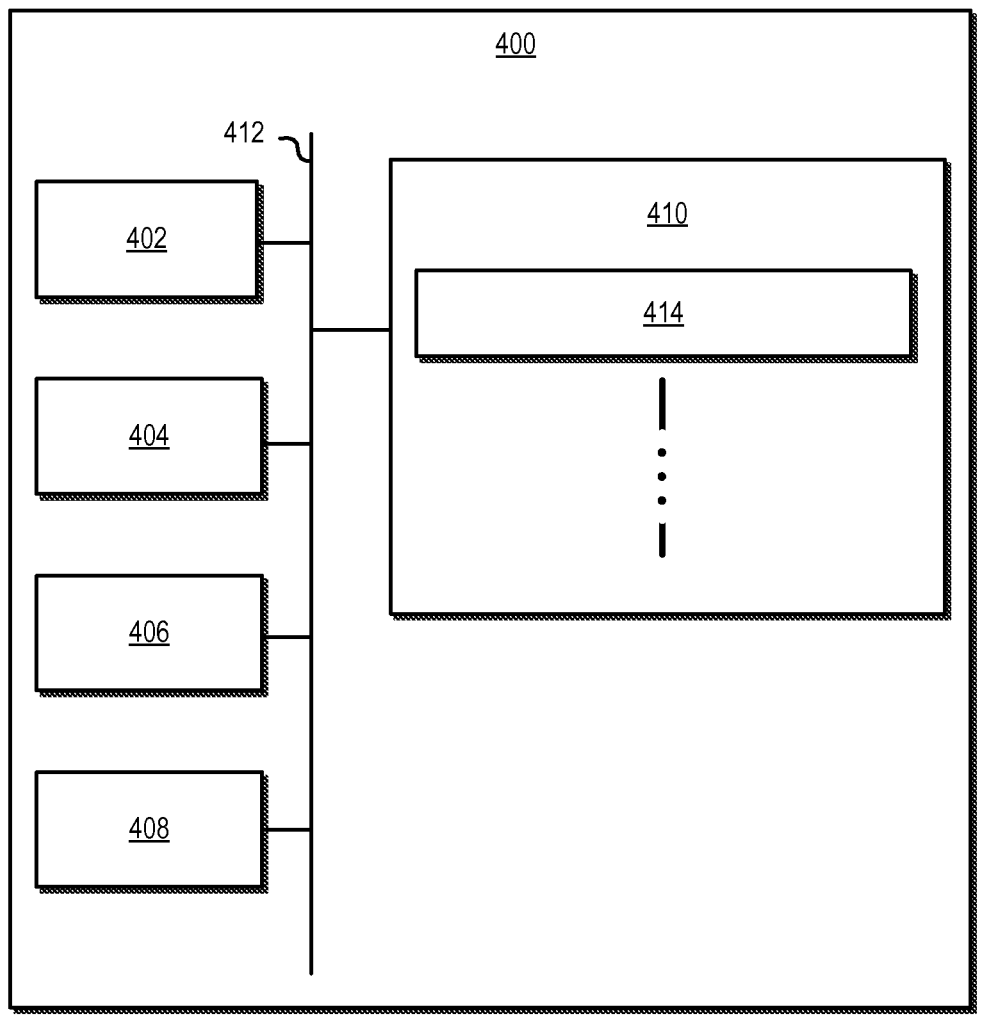
FIG. 4 illustrates an exemplary system for implementing certain embodiments of the systems and methods disclosed herein

FIG. 4 illustrates an exemplary system for implementing certain embodiments of the systems and methods disclosed herein. In certain embodiments, the computer system 400 may be a personal computer system, a server computer system, an on-board vehicle computer, an internal battery pack control system, an external battery system control system, and/or any other type of system suitable for implementing the disclosed systems and methods. In further embodiments, the computer system 400 may be any portable electronic computer system or electronic device including, for example, a notebook computer, a smartphone, and/or a tablet computer.

As illustrated, the computer system 400 may include, among other things, one or more processors 402, random access memory ("RAM") 404, a communications interface 406, a user interface 408, and a non-transitory computer-readable storage medium 410. The processor 402, RAM 404, communications interface 406, user interface 408, and computer-readable storage medium 410 may be communicatively coupled to each other via a common data bus 412. In some embodiments, the various components of the computer system 400 may be implemented using hardware, software, firmware, and/or any combination thereof.

The user interface 408 may include any number of devices allowing a user to interact with the computer system 400. For example, the user interface 408 may be used to display an interactive interface to a user. The user interface 408 may be a separate interface system communicatively coupled with the computer system 400 or, alternatively, may be an integrated system such as a display interface for a laptop or other similar device. In certain embodiments, the user interface 408 may be produced on a touch screen display. The user interface 408 may also include any number of other input devices including, for example, keyboard, trackball, and/or pointer devices.

The communications interface 406 may be any interface capable of communicating with other computer systems, peripheral devices, and/or other equipment communicatively coupled to computer system 400. For example, the communications interface 406 may allow the computer system 400 to communicate with other computer systems and/or sensors (e.g., computer systems associated with external databases and/or the Internet, current and/or voltage sensors, etc.), allowing for the transfer as well as reception of data from such systems and/or sensors. The communications interface 406 may include, among other things, a modem, a satellite data transmission system, an Ethernet card, and/or any other suitable device that enables the computer system 400 to connect to databases and networks, such as LANs, MANs, WANs and the Internet. In further embodiments, the communications interface 406 may further be capable of communication with one or more sensors (e.g., current sensors, voltage sensors) and/or other systems configured to measure and/or otherwise provide information for use in connection with the disclosed embodiments.

Processor 402 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 402 may be configured to execute computer-readable instructions stored on non-transitory computer-readable storage medium 410. Computer-readable storage medium 410 may store other data or information as desired. In some embodiments, the computer-readable instructions may include computer executable functional modules 414. For example, the computer-readable instructions may include one or more functional modules configured to implement all or part of the functionality of the systems and methods described above. Specific functional models that may be stored on computer-readable storage medium 410 may include a module configured to measure and/or otherwise receive information relating to a current through a fuse, a module configured to store the information in one or more associated data buckets and/or apply associated weights to the stored information, a module configured to determine a state of the fuse based on the weighted information, a module configured to implement an associated control action, and/or any other module or modules configured to implement the systems and methods disclosed herein.

Although the foregoing has been described in some detail for purposes of clarity, it will be apparent that certain changes and modifications may be made without departing from the principles thereof. Certain features of the embodiments disclosed herein may be configured and/or combined in any suitable configuration or combination. Additionally, certain systems and/or methods disclosed herein may be utilized in battery systems, ESS systems, and/or fuses not included in a vehicle and/or a MSD (e.g., a backup power battery system or the like). It is noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. Various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method for determining a state of a fuse comprising:
receiving current information from a current sensor associated with a fuse included in a manual service disconnect associated with an energy storage system included in a vehicle, the current information comprising a measured current through the fuse over time;
identifying one or more current events based on the received current information, the one or more current events being identified based on the received current information being within one or more ranges of a plurality of defined current ranges included in a characterization table associated with the fuse;
associating the one or more identified current events with a current range of the plurality of defined current ranges;
determining count information for each current range of the plurality of defined current ranges based on a number of identified current events associated with each current range of the plurality of defined current ranges
generating weighted count information for each current range of the plurality of defined current ranges by applying a weight associated with each current range of the plurality of defined current ranges accessed from characterized fuse information to the count information for each current range of the plurality of defined current ranges;
determining a state of the fuse based on the weighted count information and
implementing at least one protective action based on the determined state of the fuse, the at least one protective action comprising at least one of providing a notification to an operator of the vehicle of the determined state of the fuse, providing a notification to a service technician of the determined state of the fuse, issuing a control signal to a telematics system indicating the determined state of the fuse, operating the vehicle in a limited operating mode based on the determined state of the fuse, and limiting the acceleration of the vehicle based on the determined state of the fuse.

2. The method of claim 1, wherein determining the state of the fuse based on the weighted count information comprises:
determining total count information based on the weighted count information;
comparing the total count information with a threshold; and
determining the state of the fuse based on the comparison.

3. The method of claim 2, wherein the threshold comprises a total service life of the fuse.

4. The method of claim 1, wherein the state of the fuse comprises a remaining service life of the fuse.

5. The method of claim 1, wherein the weight comprises an indication of a relative amount of impact on a service life of the fuse associated with the count information in the associated data bucket.

6. The method of claim 1, wherein the weight comprises an indication of a relative amount of impact on a service life of the fuse associated with the count information in the associated data bucket.

7. A control system configured to determine a state of a fuse comprising:
an interface configured to receive current information form a current sensor associated with a fuse included in a manual service disconnect associated with an energy storage system included in a vehicle, the current information comprising a measured current through the fuse over time;
a processor communicatively coupled to the interface;
a non-transitory computer-readable storage medium communicatively coupled to the processor and the interface storing instructions that, when executed by the processor, are configured to cause the processor to:
identify one or more current events based on the received current information, the one or more current events being identified based on the received current information being within one or more ranges of a plurality of defined current ranges included in a characterization table associated with the fuse
associate the one or more identified current events with a current range of the plurality of defined current ranges;
determine count information for each current range of the plurality of defined current ranges based on a number of identified current events associated with each current range of the plurality of defined current ranges;
generate weighted count information for each current range of the plurality of defined current ranges by applying a weight associated with each current range of the plurality of defined current ranges accessed from characterized fuse information to the count information for each current range of the plurality of defined current ranges;
determine a state of the fuse based on the weighted count information; and
implement at least one protective action based on the determined state of the fuse, the at least one protective action comprising at least one of providing a notification to an operator of the vehicle of the determined state of the fuse, providing a notification to a service technician of the determined state of the fuse, issuing a control signal to a telematics system indicating the determined state of the fuse, operating the vehicle in a limited operating mode based on the determined state of the fuse, and limiting the acceleration of the vehicle based on the determined state of the fuse.

8. The control system of claim 7, wherein determining the state of the fuse based on the weighted count information comprises:
determining total count information based on the weighted count information;
comparing the total count information with a threshold; and
determining the state of the fuse based on the comparison.

9. The method of claim 8, wherein the threshold comprises a total service life of the fuse.

10. The method of claim 7, wherein the state of the fuse comprises a remaining service life of the fuse.

11. A non-transitory computer readable medium storing instructions that, when executed by a processor, are configured to cause the processor to perform a method comprising:
receiving current information from a current sensor associated with a fuse included in a manual service disconnect associated with an energy storage system included in a vehicle, the current information comprising a measured current through the fuse over time;
identifying one or more current events based on the received current information, the one or more current events being identified based on the received current information being within one or more ranges of a plurality of defined current ranges included in a characterization table associated with the fuse;
associating the one or more identified current events with a current range of the plurality of defined current ranges;
determining count information for each current range of the plurality of defined current ranges based on identified current events associated with each current range of the plurality of defined current ranges
generating weighted count information for each current range of the plurality of defined current ranges by applying a weight associated with each current range of the plurality of defined current ranges accessed from characterized fuse information to the count information for each current range of the plurality of defined current ranges;
determining a state of the fuse based on the weighted count information; and
implementing at least one protective action based on the determined state of the fuse, the at least one protective action comprising at least one of providing a notification to an operator of the vehicle of the determined state of the fuse, providing a notification to a service technician of the determined state of the fuse, issuing a control signal to a telematics system indicating the determined state of the fuse, operating the vehicle in a limited operating mode based on the determined state of the fuse, and limiting the acceleration of the vehicle based on the determined state of the fuse.

12. The non-transitory computer-readable storage medium of claim 11, wherein the weight comprises an indication of a relative amount of impact on a service life of the fuse associated with the count information for each current range of the plurality of defined current ranges.

* * * * *